(12) United States Patent
Yang

(10) Patent No.: US 7,740,054 B2
(45) Date of Patent: Jun. 22, 2010

(54) HEAT DISSIPATION DEVICE

(75) Inventor: Chi-Hsueh Yang, Keelung (TW)

(73) Assignee: Quanta Computer Inc., Tao Yuan Shien, Taiwan (CN)

( * ) Notice: Subject to any disclaimer, the term of this patent is extended or adjusted under 35 U.S.C. 154(b) by 290 days.

(21) Appl. No.: 11/634,208

(22) Filed: Dec. 6, 2006

(65) Prior Publication Data
US 2008/0087407 A1    Apr. 17, 2008

(30) Foreign Application Priority Data
Oct. 12, 2006    (TW) .............................. 95218017 U

(51) Int. Cl.
*F28D 15/02* (2006.01)
(52) U.S. Cl. .................. 165/104.33; 165/80.3
(58) Field of Classification Search ................ 165/80.3, 165/104.33, 104.21, 104.26, 122; 361/697, 361/700
See application file for complete search history.

(56) References Cited

U.S. PATENT DOCUMENTS

| | | | |
|---|---|---|---|
| 6,650,540 B2 * | 11/2003 | Ishikawa | 361/695 |
| 6,732,786 B1 * | 5/2004 | Lee | 165/80.3 |
| 7,327,574 B2 * | 2/2008 | Frank et al. | 361/711 |
| 7,333,332 B2 * | 2/2008 | Wang | 361/700 |
| 2003/0007327 A1 * | 1/2003 | Fujiwara | 361/697 |
| 2004/0105233 A1 * | 6/2004 | Lai | 361/695 |
| 2005/0056405 A1 * | 3/2005 | Hashimoto et al. | 165/104.33 |
| 2005/0103477 A1 * | 5/2005 | Kim et al. | 165/104.33 |
| 2006/0137861 A1 * | 6/2006 | Wang et al. | 165/104.33 |
| 2006/0144573 A1 * | 7/2006 | Nitta et al. | 165/104.33 |
| 2007/0023166 A1 * | 2/2007 | Hung | 165/80.3 |
| 2007/0097644 A1 * | 5/2007 | Lu et al. | 361/700 |
| 2007/0261822 A1 * | 11/2007 | Lin et al. | 165/104.33 |

* cited by examiner

*Primary Examiner*—Teresa J Walberg
(74) *Attorney, Agent, or Firm*—Rabin & Berdo, PC

(57) ABSTRACT

A heat dissipation device includes a heat dissipation fin module, a heat pipe and a centrifugal fan. The heat pipe is connected to the heat dissipation fin module at one end and connected to a heat generating source at an opposite end. The centrifugal fan includes a motor rotating a centrifugal impeller. A spiral housing encloses the centrifugal impeller and the motor. The spiral housing includes an air inlet, a first air outlet and a second air outlet. The air inlet exposes the centrifugal impeller such that the rotating centrifugal impeller introduces air through the air inlet. The first air outlet is connected to the heat dissipation fin module and the heat pipe, the second air outlet exposes the heat pipe. An isolation wall is disposed between the second air outlet and the air inlet.

19 Claims, 2 Drawing Sheets

HEAT DISSIPATION DEVICE

RELATED APPLICATIONS

The present application is based on, and claims priority from, Taiwan Application Serial Number 95218017, filed on Oct. 12 2006, the disclosure of which is hereby incorporated by reference herein in its entirety.

BACKGROUND

1. Field of Invention

The present invention relates to a heat dissipation device.

2. Description of Related Art

As notebook PCs become thinner, space for heat convection and heat dissipation inside the case housing of the notebook PC is drastically reduced. When it comes to high-frequency components, such as the CPU (central processing unit) and graphics processing chip, the heat dissipation design hits a bottleneck. Thus, the mainstream framework of heat dissipation design is force heat convection with a centrifugal fan.

Even if the centrifugal fan can improve the heat dissipation a lot, it is still hard to meet the demanding standards of a notebook computer. Those standards for heat dissipation include not only enabling the notebook computer to operate properly, but also standards for noise and housing temperature. Therefore, heat dissipation including that includes a centrifugal fan still needs an enhancement to overcome forgoing problems.

SUMMARY

A heat dissipation device includes a heat dissipation fin module, a heat pipe and a centrifugal fan. The heat pipe is connected to the heat dissipation fin module at one end and connected to a heat generating source at the opposite end. The centrifugal fan includes a motor rotating a centrifugal impeller. A spiral housing encloses the centrifugal impeller and the motor. The spiral housing includes an air inlet, a first air outlet and a second air outlet. The air inlet exposes the centrifugal impeller such that the rotating centrifugal impeller introduces air through the air inlet. The first air outlet is connected to the heat dissipation fin module and the heat pipe, the second air outlet exposes the heat pipe. An isolation wall is disposed between the second air outlet and the air inlet.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
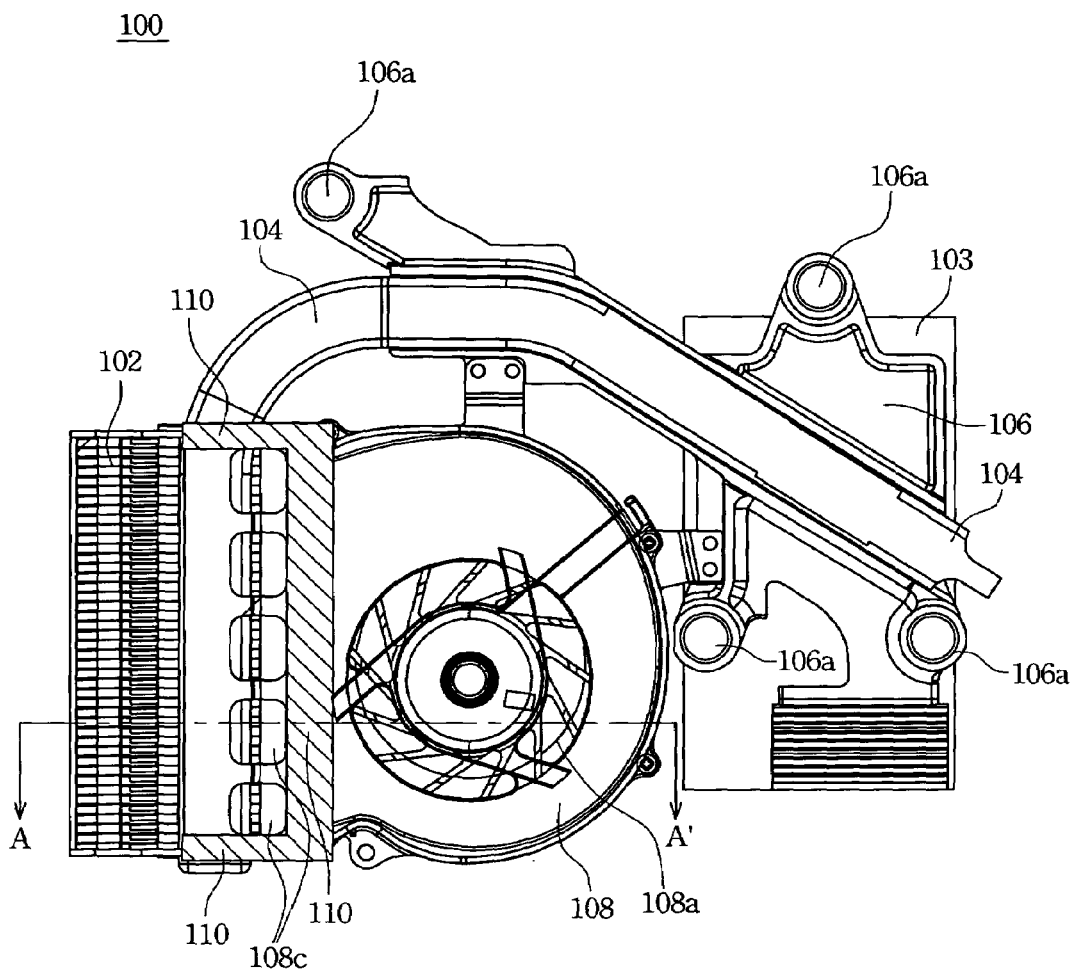
FIG. 1 illustrates a top view of a heat dissipation device according to one embodiment of this invention.

Reference will now be made in detail to the present embodiments of the invention, examples of which are illustrated in the accompanying drawings. Wherever possible, the same reference numbers are used in the drawings and the description to refer to the same or like parts.

FIG. 1 illustrates a top view of a heat dissipation device according to one embodiment of this invention. The heat dissipation device 100 includes a heat dissipation fin module 102, a heat pipe 104 and a centrifugal fan. The heat pipe 104 is connected to the heat dissipation fin module 102 at one end, and is connected to a heat generating source 103, i.e. a central unit processor or a graphics processing chip, at an opposite end. A fastener 106 secures the heat pipe 104 to the heat generating source 103. The fastener 106 includes several screw holes 106a through which bolts can be screwed. The heat pipe 104 can transfer heat from the heat generating source 103 to the heat dissipation fin module 102 rapidly. The heat dissipation fin module 102 includes a plurality of heat dissipation fins, thereby increasing heat dissipation area. An air outlet of the centrifugal fan spiral housing 108 links to the heat dissipation fin module 102 such that with the air outlet the airflow can be provided to remove heat from the heat dissipation fins. Several extra air outlets 108c are designed on the spiral housing 108 to increase output airflow and release the pressure inside the spiral housing 108. An isolation wall 110 is disposed between air outlets 108c and air inlets 108a to isolate airflow between air outlets 108c and the air inlets 108a, i.e. preventing airflow out of air outlets 108c from flowing back into the air inlets 108a. The isolation wall 110 is disposed around a portion of the air outlets 108c, nearer to the air inlet 108a than other portions of the air outlets 108c. That is, the isolation wall 110 is not disposed around a portion of the air outlets 108c, nearer to the heat dissipation fin module 102 than other portions of the air outlets 108c.

Figure 2:
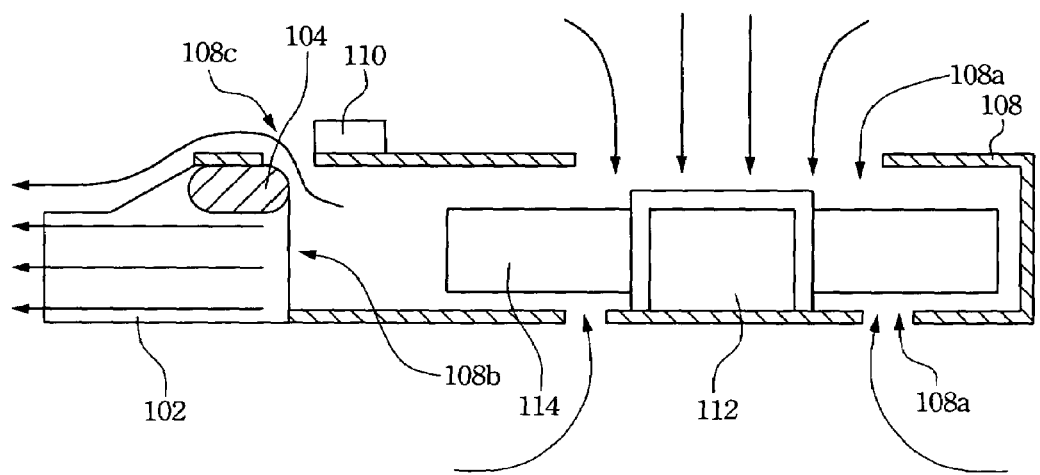
FIG. 2 illustrates a cross-sectional view taken along A-A' in FIG. 1.

FIG. 2 illustrates a cross-sectional view taken along A-A' in FIG. 1. The spiral housing 108 of the centrifugal fan encloses a motor 112 and a centrifugal impeller 114. The air inlets 108a of the spiral housing 108 expose the centrifugal impeller 114. The air inlets 108a may be positioned on two opposite sides or either one of the two opposite sides of the spiral housing 108. When the motor 112 rotates the centrifugal impeller 114, airflow is introduced into the spiral housing 108 through the air inlets 108a. An air outlet 108b of the spiral housing 108 is connected to the heat dissipation fin module 102 and the heat pipe 104. Extra air outlets 108c of the spiral housing 108 expose the heat pipe 104. When the airflow is introduced into the spiral housing 108, a part of airflow is blown out through the air outlet 108b and directed into the heat dissipation fin module 102, other parts of the airflow, guided by the heat pipe 104, are blown out through the air outlets 108c and then rejoin the airflow blown out through the air outlet 108b. The isolation wall 110 is disposed between air outlets 108c and air inlets 108a to isolate airflow between air outlets 108c and the air inlets 108a, i.e. preventing airflow out of air outlets 108c from flowing back into the air inlets 108a. As shown, these air outlets 108b and 108c are disposed at a same edge of the spiral housing. In another embodiment, the isolation wall 110 may be unnecessary, i.e. air outlets 108c may be far enough away from the air inlets 108a. The isolation wall 110 can be made of elastic and thermal insulation material such that the isolation wall 110 can serve as a buffer to isolate heat and vibrations.

According to embodiments of this invention, the centrifugal fan includes extra air outlets to release the pressure inside the spiral housing and to decrease high frequency noises. Moreover, extra air outlets are particularly located adjacent to the heat pipe such that airflow can be guided by the heat pipe and blown out through extra air outlets. Therefore, airflow of the centrifugal fan is accelerated so as to remove heat from the heat dissipation fin module efficiently.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation device, comprising:
   a heat dissipation fin module;
   a heat pipe, connected to the heat dissipation fin module at one end and connected to a heat generating source at an opposite end; and
   a centrifugal fan, comprising:
      a centrifugal impeller;
      a motor, rotating the centrifugal impeller; and
      a spiral housing, enclosing the centrifugal impeller and the motor, the spiral housing comprising an air inlet, a first air outlet and a second air outlet, the air inlet exposing the centrifugal impeller such that the rotating centrifugal impeller introduces air through the air inlet, the first air outlet connecting to the heat dissipation fin module and the heat pipe, the first air outlet and the second air outlet being disposed at a same edge of the spiral housing and positioned to divide the air into a first portion flowing below the heat pipe and a second portion flowing out of the spiral housing and above the heat pipe, the heat pipe being visible when viewed through the second air outlet,
   wherein the heat generating source is located at an end of the heat pipe distal from the heat dissipation fin module and the second air outlet.

2. The heat dissipation device of claim 1, wherein the heat dissipation fin module comprises a plurality of heat dissipation fins.

3. The heat dissipation device of claim 1, further comprising a fastener securing the heat pipe to the heat generating source.

4. The heat dissipation device of claim 3, wherein the heat generating source is a processor.

5. A heat dissipation device, comprising:
   a heat dissipation fin module;
   a heat pipe, connected to the heat dissipation fin module at one end and connected to a heat generating source at an opposite end; and
   a centrifugal fan, comprising:
      a centrifugal impeller;
      a motor, rotating the centrifugal impeller;
      a spiral housing, enclosing the centrifugal impeller and the motor, the spiral housing comprising an air inlet, a first air outlet and a second air outlet, the air inlet exposing the centrifugal impeller such that the rotating centrifugal impeller introduces air through the air inlet, the first air outlet connecting to the heat dissipation fin module and the heat pipe, the first air outlet and the second air outlet being disposed at a same edge of the spiral housing and positioned to divide the air into a first portion flowing below the heat pipe and a second portion flowing out of the spiral housing and above the heat pipe, the heat pipe being visible when viewed through the second air outlet; and
   an isolation wall, disposed on an outer surface of the spiral housing and disposed between the second air outlet and the air inlet,
   wherein the heat generating source is located at an end of the heat pipe distal from the heat dissipation fin module and the second air outlet.

6. The heat dissipation device of claim 5, wherein the isolation wall is made of elastic and thermal insulation material.

7. The heat dissipation device of claim 5, wherein the isolation wall is disposed around a portion of the second air outlet, wherein the portion is nearer to the air inlet than other portions of the second air outlet.

8. The heat dissipation device of claim 7, wherein the isolation wall is made of elastic and thermal insulation material.

9. The heat dissipation device of claim 5, wherein the isolation wall is not disposed around a portion of the second air outlet, wherein the portion is nearer to the heat dissipation fin module than other portions of the second air outlet.

10. The heat dissipation device of claim 9, wherein the isolation wall comprises an elastic and thermal insulation material.

11. The heat dissipation device of claim 5, further comprising a fastener securing the heat pipe to the heat generating source.

12. The heat dissipation device of claim 11, wherein the heat generating source is a processor.

13. A heat dissipation device, comprising:
   a heat dissipation fin module;
   a heat pipe, connected to the heat dissipation fin module at one end and connected to a heat generating source at an opposite end; and
   a centrifugal fan, comprising:
      a centrifugal impeller;
      a motor, rotating the centrifugal impeller;
      a spiral housing, enclosing the centrifugal impeller and the motor, the spiral housing comprising an air inlet, a first air outlet and a second air outlet, the air inlet exposing the centrifugal impeller such that the rotating centrifugal impeller introduces air through the air inlet, the first air outlet connecting to the heat dissipation fin module and the heat pipe, the first air outlet and the second air outlet being disposed at a same edge of the spiral housing and positioned to divide the air into a first portion flowing below the heat pipe and a second portion flowing out of the spiral housing and above the heat pipe, the heat pipe being visible when viewed through the second air outlet; and
   means for isolating airflow between the second air outlet and the air inlet,
   wherein the heat generating source is located at an end of the heat pipe distal from the heat dissipation fin module and the second air outlet.

14. The heat dissipation device of claim 13, wherein the heat dissipation fin module comprises a plurality of heat dissipation fins.

15. The heat dissipation device of claim 13, further comprising a fastener securing the heat pipe to the heat generating source.

16. The heat dissipation device of claim 13, wherein the heat generating source is a processor.

17. The heat dissipation device of claim 1,
   wherein the heat pipe is connected to the heat dissipation fin module at a first end thereof and connected to the heat generating at a second end thereof opposite to the first end; and the first air outlet is connected to the heat dissipation fin module and the first end of the heat pipe.

18. The heat dissipation device of claim 1, wherein the heat pipe is connected to the heat dissipation fin module at a first end thereof and connected to the heat generating at a second end thereof opposite to the first end; and the second air outlet exposes the first end of the heat pipe.

19. The heat dissipation device of claim 1, wherein the heat pipe is connected to the heat dissipation fin module at a first end thereof and connected to the heat generating at a second end thereof opposite to the first end;

the first air outlet is connected to the heat dissipation fin module and the first end of the heat pipe; and the second air outlet exposes the first end of the heat pipe.

* * * * *